United States Patent

Choi

[11] Patent Number: 5,937,016
[45] Date of Patent: Aug. 10, 1999

[54] SYNCHRONIZATION METHOD IN VITERBI DECODER

[75] Inventor: Young-Bae Choi, Seoul, Rep. of Korea

[73] Assignee: Daewoo Electronics Co., Ltd., Seoul, Rep. of Korea

[21] Appl. No.: 08/916,204

[22] Filed: Aug. 22, 1997

[30] Foreign Application Priority Data

Aug. 23, 1996 [KR] Rep. of Korea ............. 96-35230
Aug. 23, 1996 [KR] Rep. of Korea ............. 96-35231

[51] Int. Cl.$^6$ ........................................ H03D 1/00
[52] U.S. Cl. ............................. 375/341; 371/37.4
[58] Field of Search .................... 375/341, 279, 375/327, 262, 359, 260, 365, 366; 371/43.1, 43.6, 43.7, 43.2, 47.1, 46, 37.8, 40.11; 329/304

[56] References Cited

U.S. PATENT DOCUMENTS

| | | | |
|---|---|---|---|
| 5,509,020 | 4/1996 | Iwakiri et al. | 371/43.7 |
| 5,691,992 | 11/1997 | Molnar et al. | 371/43.2 |
| 5,710,783 | 1/1998 | Luthi et al. | 371/42 |
| 5,832,001 | 11/1998 | Choi | 371/43.2 |

*Primary Examiner*—Tesfaldet Bocure
*Assistant Examiner*—Emmanuel Bayard
*Attorney, Agent, or Firm*—Pillsbury Madison & Sutro LLP

[57] ABSTRACT

A synchronization method in Viterbi decoder is disclosed. The synchronization method performs a fast and an effective synchronization by depuncturing and Viterbi-decoding transmitted convolutional codes punctured in a predetermined puncturing pattern assuming that a code rate is 5/6, comparing the calculated CBER to a high/low threshold value, determining a code rate group to which the code rate of the convolutional codes belong, and performing a code rate detecting process, a phase synchronization and a pattern synchronization. Therefore, when performing the Viterbi decoding, a fast and more effective synchronization can be performed with improved efficiency.

2 Claims, 6 Drawing Sheets

SYNCHRONIZATION METHOD IN VITERBI DECODER

BACKGROUND OF THE INVENTION

1. Field of the Invention

The present invention relates to a synchronization apparatus in a Viterbi decoder, and more particularly to synchronization method and apparatus for performing a fast and effective synchronization during Viterbi decoding of convolutional codes punctured in a predetermined puncturing pattern.

2. Description of the Prior Art

In general, Viterbi algorithm is used as a practical and efficient method for a maximum-likelihood decoding of convolutional codes. In the Viterbi algorithm, path distances of two different paths which meet at an arbitrary state are compared by using a trellis diagram. By the comparison, the path with a shorter distance, namely a path of the lowest error generation probability, is selected as a survivor path. A Viterbi decoder using the Viterbi algorithm is, for example, used for error correction in satellite communication systems, since the decoder has a high random error correction capability.

In digital communication systems, the punctured coding technique is used to obtain a high transmission rate for channels having limited band width. The codes punctured with this technique having code rates of the form n/(n+1) can be processed by a rate 1/2 Viterbi decoder. Prior to transmission, punctured codes are generated by deleting certain codewords from the rate 1/2 convolutionally encoded data stream. This increases the code rate of the Forward Error Correction (FEC) system. The code rate refers to the ratio of information bit rate to the rate of transmitted codewords.

In a transmission channel using a Quadrature Phase Shift Keying (QPSK) modulation, a rate 3/4 (R=3/4) encoding system using the punctured coding technique will be proposed as an example, here. Each transmission symbol, D(n) is comprised of two codewords, C0(n) and C1(n). In three encoded symbols from a code rate 1/2 convolutional encoder, prior to transmission over the channel, two of every six codewords punctured in a specific pattern are not transmitted. For example, according to corresponding puncture patterns, codewords C0(1) and C1(1) of the symbol D(1) are transmitted as a single QPSK symbol without modification, and codewords C0(2) and C0(3) of the symbols D(2) and D(3), respectively, are punctured. The remaining codewords C1(2) and C0(3) of the symbols D(2) and D(3), respectively, are formed into a new symbol for transmission. As a result, a total of four codewords are transmitted for information bits D(1), D(2), and D(3), resulting in a rate 3/4 code.

The following table 1 represents an example of the puncturing patterns for the five code rates defined by European Digital Video Broadcasting Standard.

TABLE 1

| code rate | puncturing pattern | transmitted sequence |
|---|---|---|
| 1/2 | X:1<br>Y:1 | x1 y1 |
| 2/3 | X:10<br>Y:11 | x1 y1 y2 |
| 3/4 | X:101<br>Y:110 | x1 y1 y2 x3 |
| 5/6 | X:10101 | x1 y1 y2 x3 y4 x5 |

TABLE 1-continued

| code rate | puncturing pattern | transmitted sequence |
|---|---|---|
| 7/8 | Y:11010<br>X:1000101<br>Y:1111010 | x1 y1 y2 y3 y4 x5 y6 x7 |

The symbols received at the decoder are reordered into the original codeword by replacing the codewords deleted by the puncturing circuit at the encoder with the "null" or "erased" codewords. Namely, a punctured encoding process will only be effective if the encoder puncture pattern is aligned with the decoder null-insertion sequence, otherwise, the problem of synchronization occurs. At the receiving node of the digital communication system using the punctured coding technique, first, a code rate of the transmitted symbols should be grasped, second, the synchronization is performed when depuncturing according to the puncturing pattern of transmitted symbols. For these, FEC chips made in Europe or U.S.A. are equipped with a function of automatic depuncturing, however, some are equipped with a manual code rate selecting function as well as the automatic depuncturing function, since the automatic depuncturing function does not always operate properly.

Figure 1:
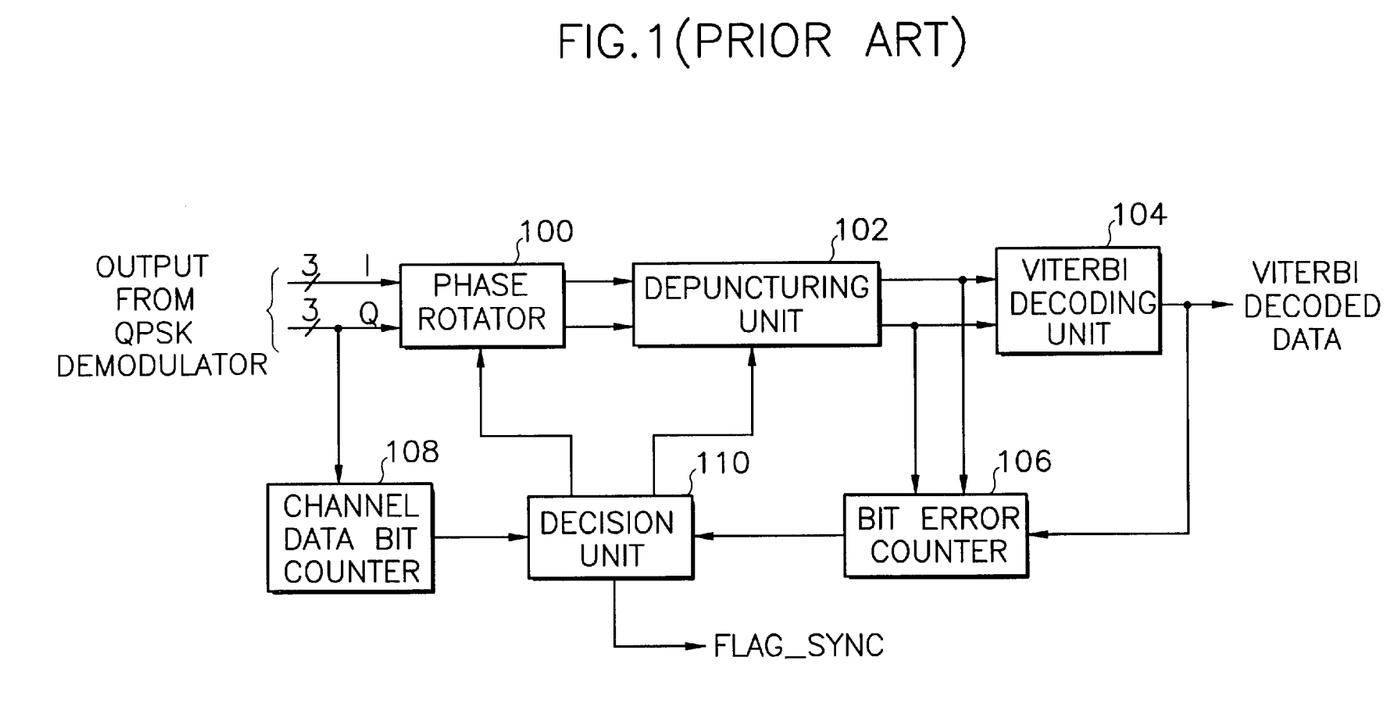
FIG. 1 is a block diagram illustrating a Viterbi decoder having a conventional synchronization apparatus.

FIG. 1 shows a block diagram of a Viterbi decoder comprising a conventional synchronization circuit. The Viterbi decoder comprises a phase rotator 100, a depuncturing unit 102, a Viterbi decoding unit 104, a bit error counter 106, a channel data bit counter 108, and a decision unit 110.

In FIG. 1, the phase rotator 100 receives in-phase I-channel data and quadrature phase Q-channel data demodulated from QPSK demodulator (not shown), rotates their phases according to a phase rotating signal from the decision unit 110, and outputs I and Q-channel data with rotated phase to the depuncturing unit 102.

The depuncturing unit 102 performs depuncturing for the signals outputted from the phase rotator 100. At this time, the depuncturing corresponding to the code rate of the transmitting node should be performed. Additionally, the depuncturing unit 102 changes the puncturing pattern according to a pattern changing signal from the decision unit 110 to perform the depuncturing. Data depunctured in the depuncturing unit 102 are inputted into the Viterbi decoding unit 104 to be Viterbi-decoded. The decoded data are then inputted into the bit error counter 106.

The bit error counter 106 convolutionally encodes the decoded data from the Viterbi decoding unit 104, again. Then, the bit error counter 106 compares the obtained convolutionally encoded data with the depunctured data from the depuncturing unit 102, and counts the obtained bit error. The counted value from the bit error counter 106 is inputted into the decision unit 110 as a channel error bit rate (CEBR) signal.

The channel data bit counter 108 receives one of the I-channel data and the Q-channel data to count channel data bit with respect to a predetermined period and outputs the counted value to the decision unit 110 as a channel data bit rate (CDBR) signal.

The decision unit 110 is reset by a reset signal of an external mi-com (not shown). Next, to find the code rate of transmitted convolutional codes, the decision unit 110, after setting the code rate range from 1/2 to 7/8, sequentially performs a code rate detecting operation for the five code rates 1/2, 2/3, 3/4, 5/6, and 7/8. In this process. the CDBR from the channel data bit counter 108 is compared to a reference CDBR. If the CDBR concurs with the reference CDBR, the CBER from the error bit counter 106 is compared to a predetermined CBER threshold value corresponding to each code rate. The CBER threshold value corresponding to each code rate is determined through a computer simulation, under the channel environment considering the satellite power, the antenna size and the weather conditions. If the CBER is less than the predetermined CBER threshold value, the decision unit 110 outputs a sync signal to the depuncturing unit 102. Otherwise, the decision unit 110 outputs a phase rotating signal and a pattern changing signal to the phase rotator 100 and the depuncturing unit 102, respectively. And, the decision unit 110 outputs a flag-sync signal external to the FEC chip and Reed-Solomon decoder (not shown).

On the basis of European Digital Video Broadcasting Standard, there are five code rates 1/2, 2/3, 3/4, 5/6, and 7/8 such as shown in the table 1. Accordingly, there are as much puncturing patterns as each code rate's numerator. For example, there are seven kinds of puncturing patterns when the code rate is 7/8, and five kinds when the rate is 5/6. Namely, since five kinds of code rates and puncturing patterns corresponding to each code rate's numerator exist, the automatic depuncturing apparatus should detect the code rate of currently-received data as well as the puncturing pattern for the detected code rate. In addition, to decide whether the phase is true or false, namely to synchronize with the phase, the automatic depuncturing apparatus should detect the phase synchronization for both cases.

However, since the conventional synchronization method and apparatus having the above automatic depuncturing function detects the code rate, the puncturing pattern, and the phase synchronization through trial & error process using ascending order or descending order, the effective synchronization cannot be performed. Namely, first of all, from the code rate 1/2, the pattern synchronization and the phase synchronization are analyzed by comparing the measured CBER to the threshold value of CBER. If the measured CBER is larger than the threshold CBER, the trial & error process continues for each pattern synchronization and phase synchronization of the code rate 2/3. Similarly, the process is repeated for the code rates 3/4, 5/6, and 7/8. The total number of steps required for synchronization, in the worst case, is 36 steps: i.e., 36=2×1 (when the code rate is 1/2)+2×2 (when the code rate is 2/3)+2×3 (when the code rate is 3/4)+2×5 (when the code rate is 5/6)+2×7 (when the code rate is 7/8). Hence, the trial & error process consumes considerable amount of time for accurate synchronization. More particularly, since the synchronization cannot be performed properly in a unfavorable channel environment, and the above entire synchronizing process is performed for each channels, which are changed frequently by a remote control system, the conventional synchronization method and apparatus are ineffective for performing fast synchronization.

SUMMARY OF THE INVENTION

In view of the foregoing, it is an object of the present invention is to provide a method for performing a fast and an effective synchronization by depuncturing and Viterbi-decoding transmitted convolutional codes punctured in a predetermined puncturing pattern assuming that a code rate is 5/6, comparing the calculated CBER to a high/low threshold value, determining a code rate group to which the code rate of the convolutional codes belong, and performing a code rate detecting process, a phase synchronization and a pattern synchronization.

In order to achieve the above object, the present invention provides a synchronization method for performing a fast synchronization in a Viterbi decoder for decoding transmitted convolutional codes which are QPSK modulated and punctured according to a predetermined code rate among a plurality of code rates having a first group of low code rates and a second group of high code rates, comprising the steps of:

a) depuncturing and Viterbi decoding the convolutional code with a predetermined median code rate among plurality of code rates comprising the first and second group;

b) calculating a channel bit error rate using the Viterbi decoded data obtained from the step a);

c) comparing the channel bit error rate obtained from the step b) with a high/low threshold value and selecting the first group or second group having the code rate of currently received channel, according to the comparison result;

d) arbitrary changing a code rate into one of the code rate from the first group or second group selected in step c), changing a phase and puncturing pattern according to the changed code rate, and depuncturing and Viterbi decoding the convolutional code with respect to the changed phase and puncturing pattern;

e) calculating the channel bit error rate using the Viterbi decoded data obtained from the step d), comparing this calculated channel bit error rate to a synchronization threshold value corresponding to the changed code rate in the step d), and determining whether the synchronization is achieved according the comparison result; and f) repeating the step d) and step e) with respect to the different code rates, phases, and puncturing patterns, if the synchronization is not achieved in the step e).

BRIEF DESCRIPTION OF THE DRAWINGS

The above and other objects, features, and advantages of the present invention will be apparent from the following detailed description of the preferred embodiments of the invention in conjunction with the accompanying drawings, in which:

FIGS. 3A to 3C are a flowchart describing a synchronization method according to the present invention in a Viterbi decoder.

DESCRIPTION OF THE PREFERRED EMBODIMENT

Reference will now be made in detail to the present invention, examples of which are illustrated in the accompanying drawings. Wherever possible, the same reference numbers will be used throughout the drawings to refer to the same or like parts.

Figure 2:
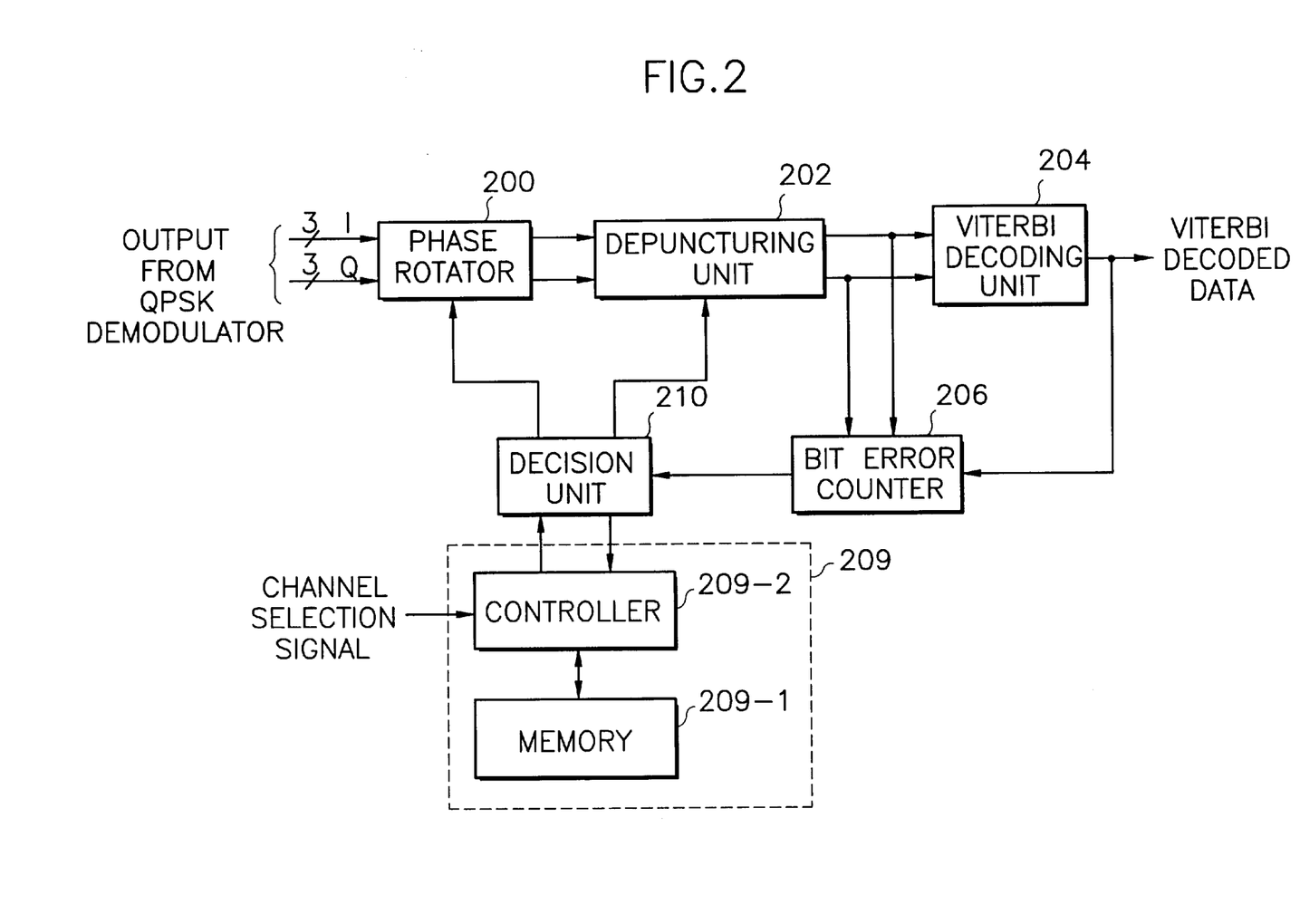
FIG. 2 is a diagram illustrating a Viterbi decoder having a synchronization apparatus according to the present invention.

FIG. 2 shows a block diagram of a Viterbi decoder having synchronization apparatus in accordance with the present invention. The synchronization apparatus shown in FIG. 2 comprises a phase rotator 200, a depuncturing unit 202, a Viterbi decoding unit 204, a bit error counter 206, a storage unit 209, and a decision unit 210. Here, the storage unit 209 is composed of a memory 209-1 and a controller 209-2.

Now, a synchronization operation of the Viterbi decoder comprising the above components will be described in detail. Here, since operations of the phase rotator 200, the depuncturing unit 202, the Viterbi decoding unit 204, and the bit error counter 206 are similar to the operations of a conventional synchronization apparatus in FIG. 1, the operating explanation is omitted from the description. Accordingly, operations of the storage unit 209 and the decision unit 210 will be described in detail.

Referring to FIG. 2, when a synchronization is adjusted once in the decision unit 210, code rates of each synchronized channel are stored in the memory 209-1 of the storage unit 209 in a look-up table format. Here, each channel is considered as a normal environment of channel. In the controller 209-2 of the storage unit 209, when the selected channel by a channel selection signal, which is generated during channel selection by a remote controller is the synchronized channel, the code rate of the corresponding channel is read from the memory 209-1 and is outputted to the decision unit 210. Otherwise, the controller 209-2 inputs a code rate detecting instruction to the decision unit 210.

When the code rate read from the memory 209-1 via the controller 209-2 is provided to the decision unit 210, only a phase synchronization and a pattern synchronization are performed with respect to this code rate in the decision unit 210 without detecting a code rate of currently-received convolutional code. Meanwhile, when the code rate detecting instruction from the controller 209-2 is provided to the decision unit 210, a depuncturing process and a Viterbi-decoding process are performed on the assumption that the code rate of the transmitted convolutional codes is 5/6 and a synchronization is performed by using the obtained CBER in the decision unit 210.

Figure 3A:
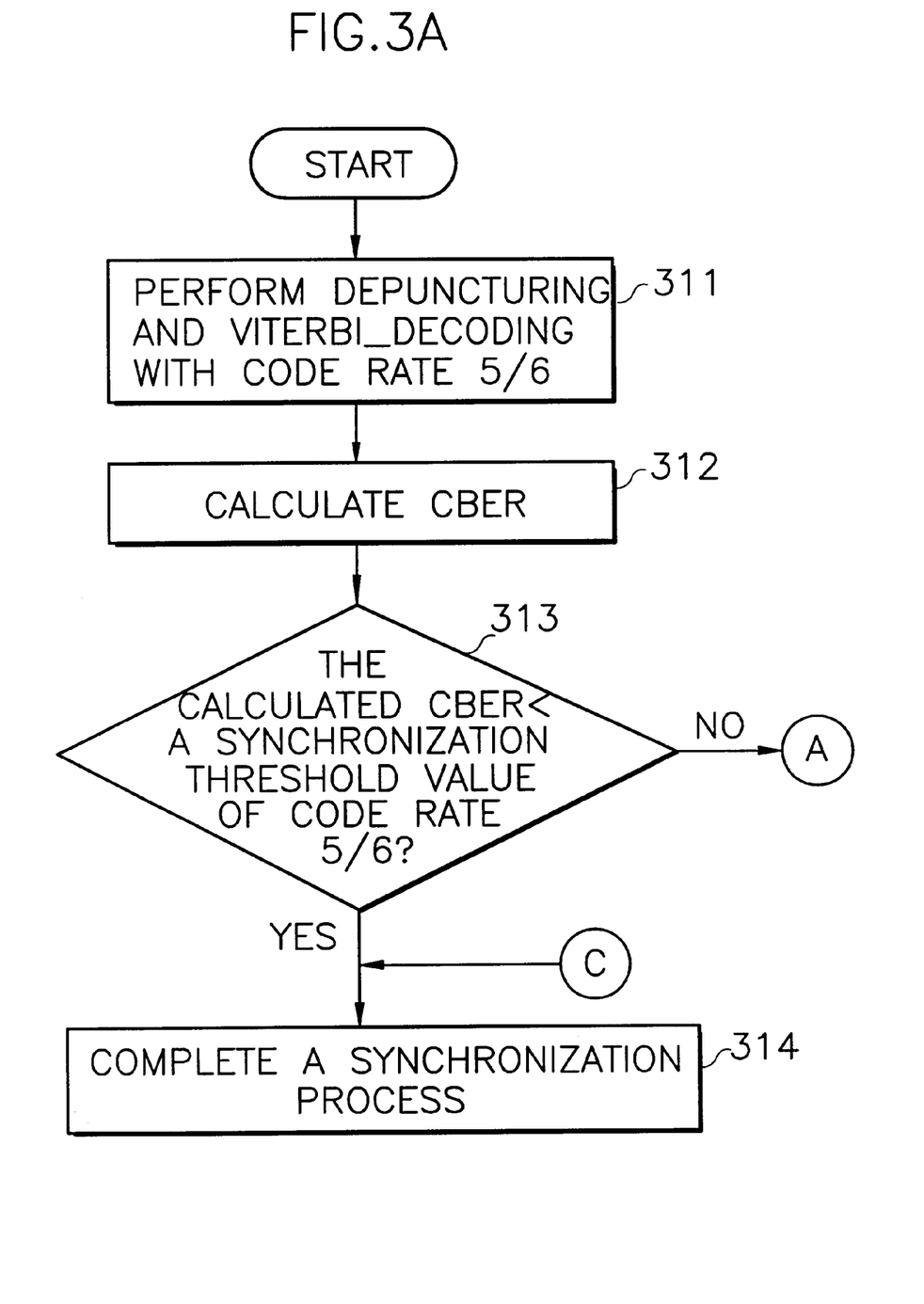
Figure 3B:
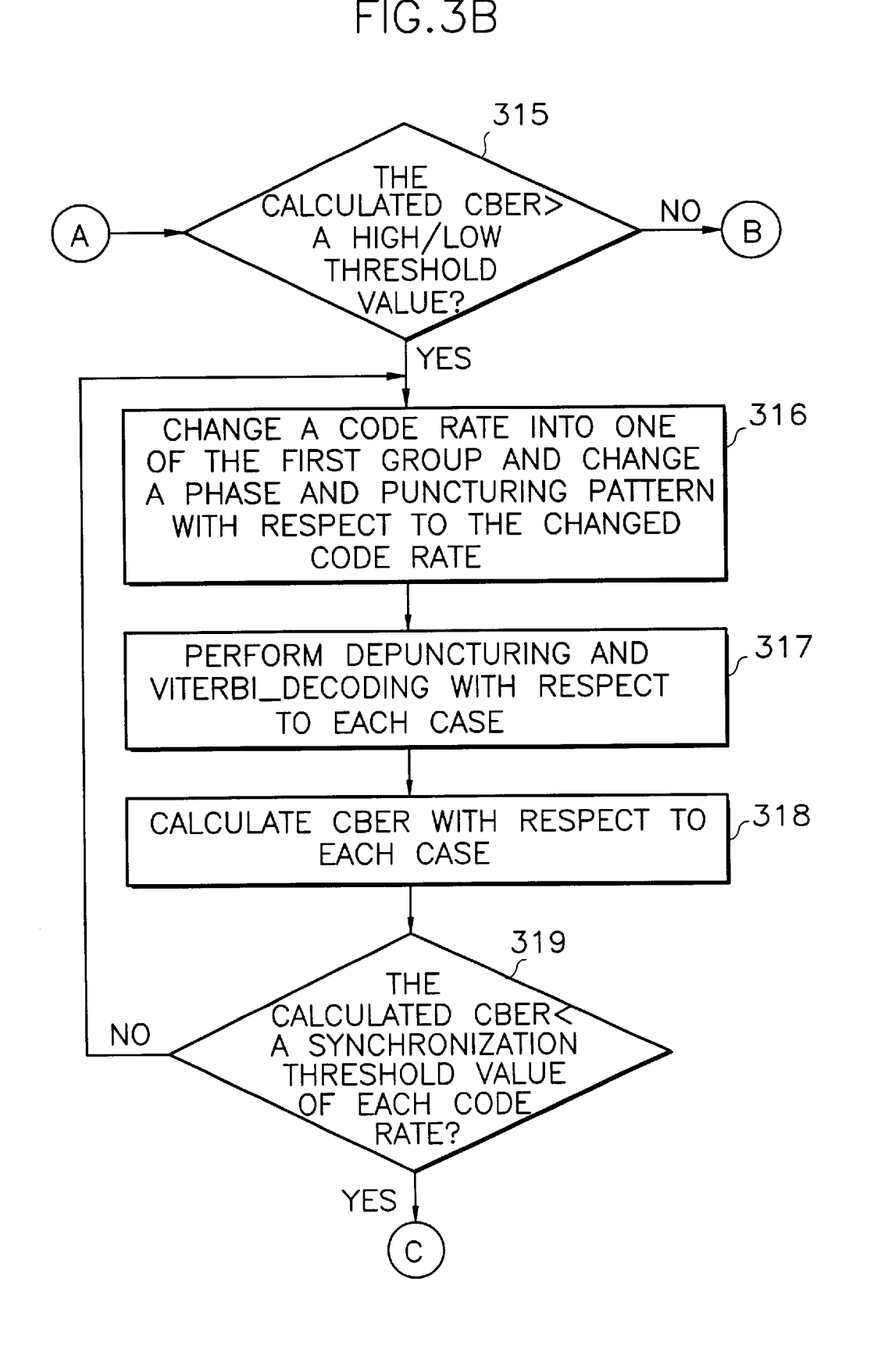
Figure 3C:
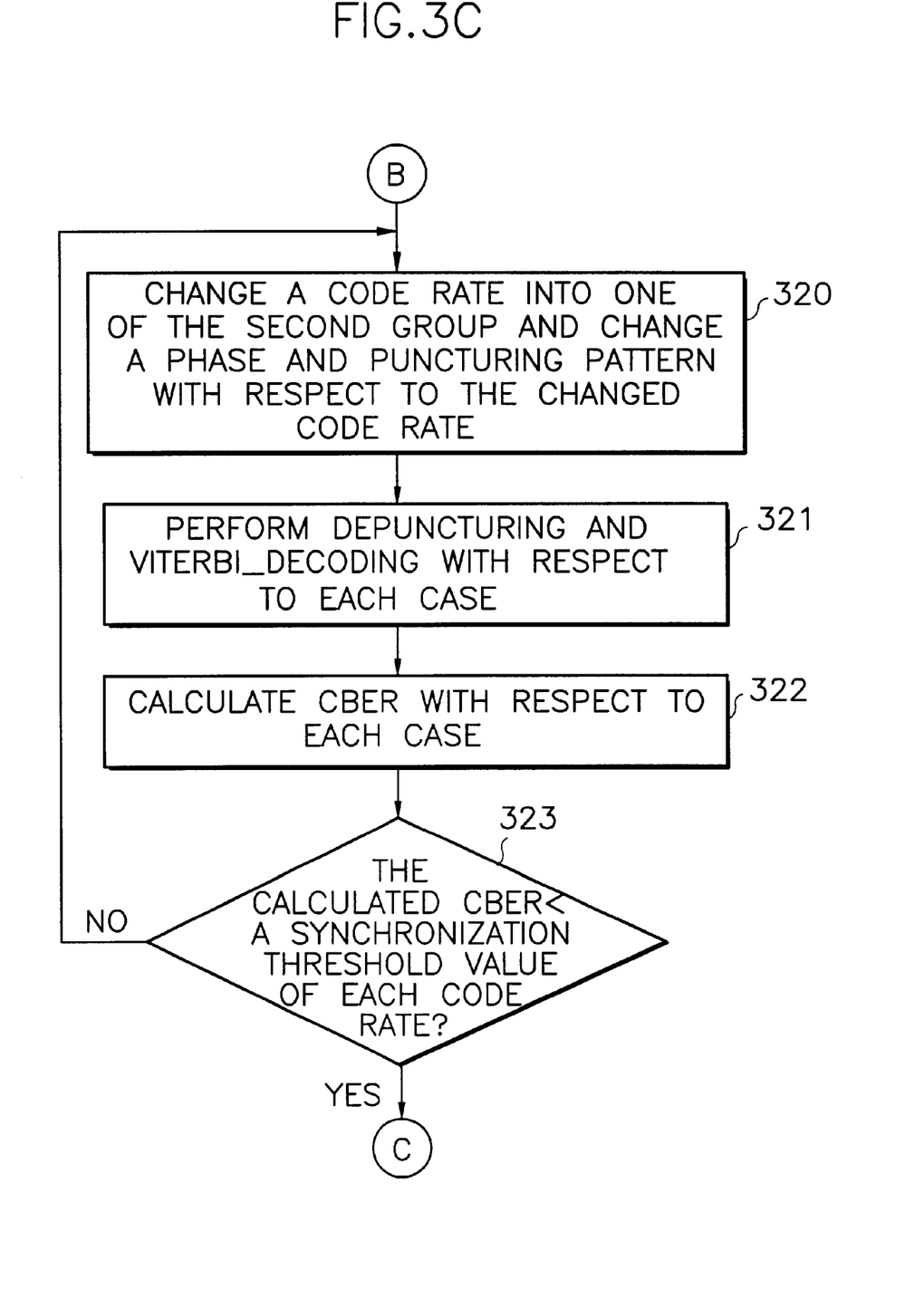

FIGS. 3A to 3C show a flowchart describing the synchronization method in accordance with the present invention in the Viterbi decoder. The synchronization method comprises a step 311 of depuncturing and Viterbi decoding the convolutional code with a predetermined median code rate (here, code rate 5/6) among a plurality of code rates comprising a first group of low code rates (here, code rate 1/2, 2/3 and 3/4) and a second group of high code rates (here, code rate 5/6 and 7/8), a step 312 of calculating a channel bit error rate using the Viterbi decoded data, a step 313 of comparing the channel bit error rate with a synchronization threshold value of code rate 5/6 and determining a completion of synchronization, a step 315 of comparing the channel bit error rate with a high/low threshold value and selecting the first group or second group having the code rate of currently received channel, according to the comparison result, when synchronization is not achieved steps 316 and 320 of arbitrarily changing a code rates into one of the code rate from the selected group, changing a phase and puncturing pattern according to the changed code rate, and depuncturing and Viterbi decoding the convolutional code with respect to the changed phase and puncturing pattern, and steps 317 to 319 and 321 to 323 of calculating the channel bit error rate using the Viterbi decoded data, comparing this calculated channel bit error rate to a synchronization threshold value corresponding to the changed code rate, determining whether the synchronization is achieved according the comparison result and repeating the synchronization with respect to the different code rates, phases, and puncturing patterns, if the synchronization is not achieved.

Figure 4:
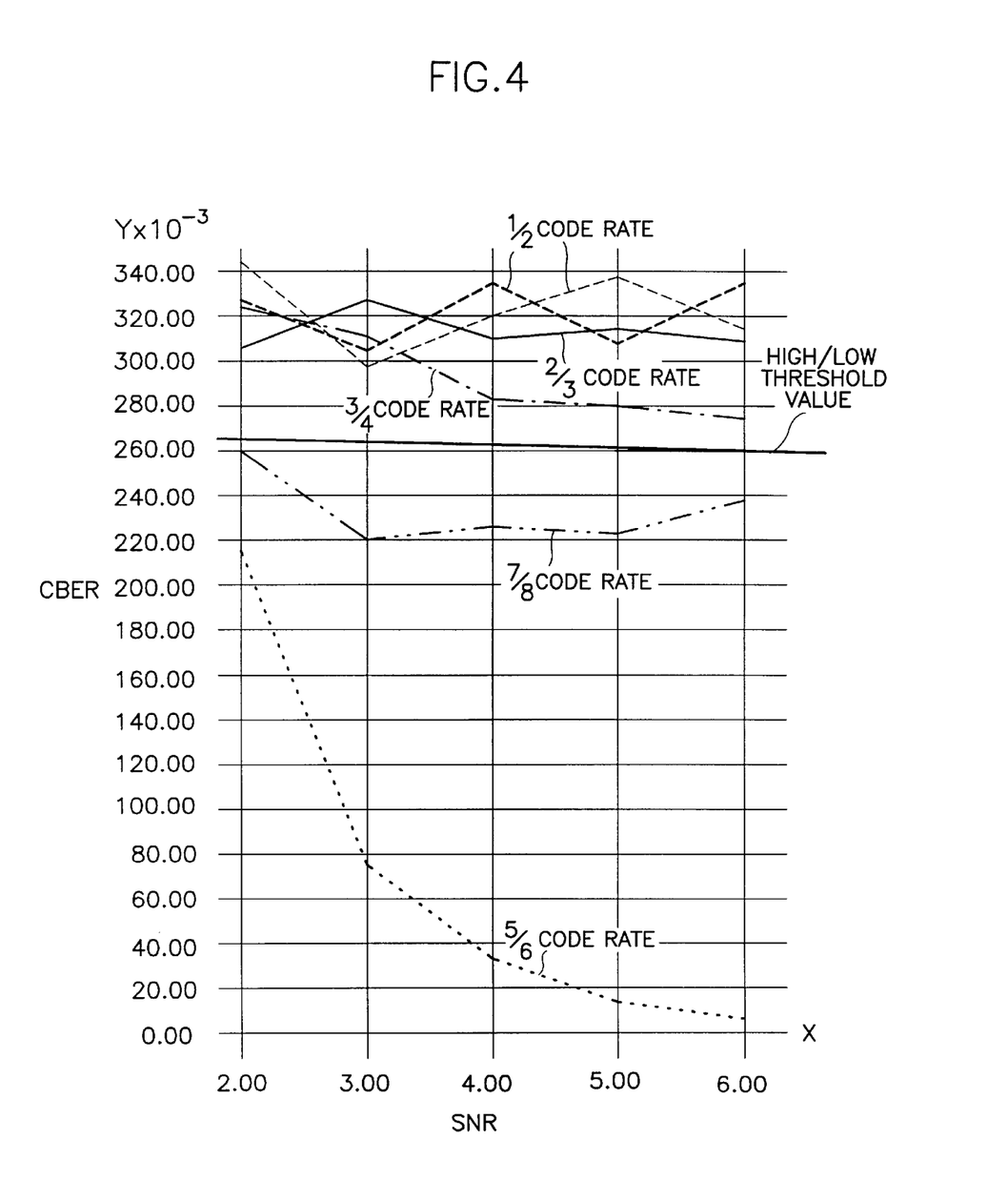
FIG. 4 is a graph illustrating a relationship between a channel bit error rate and signal to noise ratio according to each code rate.

FIG. 4 shows a graph of a relationship between the calculated CBER and signal to noise ratio (SNR) according to each code rate. The X and Y-axis represent the SNR and the CBER, respectively. Simulation and empirical results have shown inaccurate distinction between the rate 5/6 and the rate 7/8 when SNR is small, and only the low and high rates are distinguished when SNR is small. In FIG. 4, in order to distinguish the first group of high rates from the second group of low rates, the CBER must correspond to the high/low threshold range of $260.00 \times 10^{-3} - 280.00 \times 10^{-3}$. Here, the rates 5/6 and 7/8 belong to the first group, and the rates 1/2, 2/3, and 3/4 belong to the second group.

Next, referring to FIGS. 2 to 4, the synchronization method of the present invention will be described in detail.

As shown in FIGS. 3A to 3C, in the step 311, the depuncturing process and the Viterbi decoding process of the convolutional code are performed in the depuncturing unit 202, and the Viterbi decoding unit 204, respectively, on the assumption that a code rate of currently received channel is 5/6.

In the step 312, a channel bit error rate using the Viterbi decoded data and the depunctured data obtained from the step 311, is calculated in the bit error counter 206. The bit error counter 206 convolutionally encodes the decoded data from the Viterbi decoding unit 204, again. Then, the bit error counter 206 compares the obtained convolutionally encoded data with the depunctured data from the depuncturing unit 202, counts the obtained bit error and outputs the counted value as CBER signal.

In the step 313, the channel bit error rate obtained from the step 312 is compared with a synchronization threshold value of code rate 5/6. The synchronization process is completed in the step 314, if the channel bit error rate is less than the synchronization threshold value of code rate 5/6. Otherwise, the step 315 is progressed.

In the step 315, the channel bit error rate obtained from the step 312 is compared with a high/low threshold value, when synchronization is not achieved in the step 313. If the channel bit error rate obtained from the step 312 is more than the high/low threshold value, according to the comparison result in the step 315, the code rate group having the code rate of currently received channel is determined as the first group and the steps 316 to 319 are progressed. Meanwhile, if the channel bit error rate obtained from the step 312 is less than the high/low threshold value, according to the comparison result in the step 315, the code rate group having the code rate of currently received channel is determined as the second group and the steps 320 to 323 are progressed.

Namely, in the step 316, a code rate is arbitrarily changed into one of the code rates from the selected first group and a phase and a puncturing pattern according to the changed code rate are changed with respect to the every cases which may be existed, for example, six kinds in code rate 3/4. In the step 317, the depuncturing and Viterbi decoding of the convolutional code are performed with respect to the changed code rate, phase and puncturing pattern. In the step 318, the channel bit error rate is calculated using the Viterbi decoded data obtained from the step 317. In the step 319, the channel bit error rate calculated in the step 318 is compared to a synchronization threshold value corresponding to the changed code rate. If the channel bit error rate calculated in the step 318 is less than the synchronization threshold value corresponding to the changed code rate, the synchronization process is completed (the step 314). Otherwise, the synchronization process returns to the step 316, and then the steps 316 to 319 are repeatedly progressed until the synchronization is achieved.

Meanwhile, in the step 320, a code rate is arbitrarily changed into one of the code rates from the selected second group and a phase and a puncturing pattern according to the changed code rate are changed with respect to the every cases which may be existed. In the step 321, the depuncturing and Viterbi decoding of the convolutional code are performed with respect to the changed code rate, phase and puncturing pattern. In the step 322, the channel bit error rate is calculated using the Viterbi decoded data obtained from the step 321. In the step 323, the channel bit error rate calculated in the step 322 is compared to a synchronization threshold value corresponding to the changed code rate. If the channel bit error rate calculated in the step 322 is less than the synchronization threshold value corresponding to the changed code rate, the synchronization process is completed (the step 314). Otherwise, the synchronization process returns to the step 320, and then the steps 320 to 323 are repeatedly progressed until the synchronization is achieved.

According to the present invention, the code rate of 5/6 is assumed, and the synchronization is performed by distinguishing the high code rates 1/2, 2/3, and 3/4 from the low rates 5/6 and 7/8. Accordingly, the synchronization method of the present invention is more effective and less time consuming than the conventional method, which performs the synchronization in an ascending or descending order of the rates 1/2, 2/3, 3/4, 5/6, and 7/8.

Additionally, according to the present invention, once the recently received channel is synchronized, the synchronized information is stored in a separate memory equipped inside the Direct Broadcasting Service (DBS) receiver. When the same channel is received again, the synchronization of the Viterbi decoder is directly performed by using the stored information and bypassing the code rate detecting step. Namely, when each synchronized code rate is stored at the receiver, the code rate detecting step is omitted at the Viterbi decoding for these channels, and only the phases and patterns need to be considered for synchronization. Accordingly, a simpler synchronization with improved efficiency can be provided. Additionally, the DBS receiver for receiving signals from hundreds of different digital channels of satellite broadcasting medium can perform the forward error correction (FEC) even under a unfavorable channel environment.

As described above, in accordance with the present invention, once storing the code rate of each synchronized channel in a normal channel environment, only the phases and patterns need to be adjusted by using the stored code rates when the same channels are received again, during the frequent change of broadcasting channel or when they are received in a unfavorable channel environment.

Hence, by utilizing the features unique to the channel environment and puncturing pattern when performing the Viterbi decoding, a fast and more effective synchronization can be performed with improved efficiency.

While this invention has been described in connection with what is presently considered to be the most practical and preferred embodiments, it is to be understood that the invention is not limited to the disclosed embodiment, but, on the contrary, it is intended to cover various modifications and equivalent arrangements included within the spirit and scope of the appended claims.

What is claimed is:

1. A synchronization method for performing a fast synchronization in a Viterbi decoder for decoding transmitted convolutional codes which are QPSK modulated and punctured according to a predetermined code rate among code rates having a first group of low code rates and a second group of high code rates, comprising the steps of:

a) depuncturing and Viterbi decoding the convolutional code with a predetermined median code rate among the code rates comprising the first and second groups;

b) calculating a channel bit error rate using the Viterbi decoded data obtained from said step a);

c) comparing the channel bit error rate obtained from said step b) with a high/low threshold value and selecting the first group or the second group to which a code rate of a currently received channel belongs, according to the comparison result;

d) changing a code rate into one of the code rates from the first group or the second group selected in step c), changing a phase and puncturing pattern according to the changed code rate, and depuncturing and Viterbi decoding the convolutional code with respect to the changed phase and puncturing pattern;

e) calculating the channel bit error rate using the Viterbi decoded data obtained from said step d), comparing this calculated channel bit error rate to a synchronization threshold value corresponding to the changed code rate in said step d), and determining whether the synchronization is achieved according the comparison result; and f) repeating said step d) and step e) with respect to the different code rates, phases, and puncturing patterns, if the synchronization is not achieved in said step e).

2. The synchronization method of claim 1, wherein said median code rate is 5/6 in case that the first group comprises code rates 1/2, 2/3 and 3/4 and the second group comprises code rates 5/6 and 7/8.

* * * * *